United States Patent [19]

Kuboki et al.

[11] Patent Number: 4,701,922
[45] Date of Patent: Oct. 20, 1987

[54] INTEGRATED CIRCUIT DEVICE

[75] Inventors: Shigeo Kuboki, Nakaminato; Ikuro Masuda, Hitachi; Toshiaki Masuda, Kitaibaraki; Terumine Hayashi, Hitachi, all of Japan

[73] Assignees: Hitachi, Ltd., Tokyo; Hitachi Engineering Co., Ltd., Hitachi, both of Japan

[21] Appl. No.: 769,311

[22] Filed: Aug. 26, 1985

[30] Foreign Application Priority Data

Sep. 4, 1984 [JP] Japan ............................... 59-185242

[51] Int. Cl.⁴ ............................................. G01R 31/28
[52] U.S. Cl. ................................... 371/25; 324/73 R; 371/15
[58] Field of Search .................. 371/25, 15; 324/73 R

[56] References Cited

U.S. PATENT DOCUMENTS

| | | | |
|---|---|---|---|
| 4,298,980 | 11/1981 | Hajdu et al. | 371/25 |
| 4,476,431 | 10/1984 | Blum | 324/73 R |
| 4,477,902 | 10/1984 | Puri et al. | 371/25 |
| 4,493,077 | 1/1985 | Agrawal et al. | 371/25 |
| 4,553,236 | 11/1985 | Zasio et al. | 371/25 X |
| 4,588,944 | 5/1986 | Rothenberger | 324/73 R |
| 4,597,042 | 6/1986 | d'Angeac et al. | 371/25 X |

*Primary Examiner*—Charles E. Atkinson
*Attorney, Agent, or Firm*—Antonelli, Terry & Wands

[57] ABSTRACT

An integrated circuit device comprises combinational circuits and sequential circuits. Each of the sequential circuits is provided with a (common) input control signal terminal for controlling the entry of main input terminal signals into the sequential circuit, a test data input/output terminal, a read/write signal terminal for controlling the transfer of the test data, and a latch circuit. The integrated circuit device is partitioned into sequential circuit groups, and combinational circuit groups used as partitioning test units, the main input-/output terminal groups of which are connected with the sequential circuit groups through wiring layers. Test data are written into and read out from the sequential circuit groups under control of read/write signal lines through bus lines dedicated to testing. Thus, a higher fault-coverage ratio can be easily obtained with a smaller number of steps and a small test circuit area.

13 Claims, 19 Drawing Figures

FIG. 3A  SIGNAL $C_1$
FIG. 3B  SIGNAL $C_2$
FIG. 3C  M AND ADDRESS ENABLE SIGNAL
FIG. 3D  READ SIGNAL
FIG. 3E  WRITE SIGNAL
FIG. 3F  DATA ON DATA BUS LINE 17-1
FIG. 3G  ADDRESS SIGNAL (37, 38)
FIG. 3H  $Q_0$ OUTPUT (MF PART)
FIG. 3I  Q OUTPUT (SF PART)

INTEGRATED CIRCUIT DEVICE

BACKGROUND OF THE INVENTION

This invention relates to an integrated circuit device and more particularly to an integrated circuit device suited for a gate array which allows diagnosis tests to be easily performed.

It is required in a semiconductor integrated circuit (hereinafter referred to as LSI) to attain a high fault-coverage close to 100% using a test pattern in order to increase its mass-productivity and reliability.

Test pattern input signals are externally applied to a semiconductor circuit device including logic circuits in order to judge if several logic elements included in the device provide desired functions and characteristics. This process is generally called a "diagnosis". Here, the input test patterns used must be ones enabling an exhaustive diagnosis of the internal logic elements. The ratio of the number of diagnosable elements relative to the total number of elements is defined as stuck-fault coverage ratio. Therefore, these input test patterns must be made so that the coverage ratio suited for actual use may be attained with the number of the steps being as small as possible. Common logic integrated circuit devices, however, generally require thousands of steps for actual use, and further with the development of higher integration device in recent years, tens of thousands of steps are required to provide the coverage ratio close to 100%. Therefore, the realization of satisfactory coverage ratios has become difficult.

Thus, integration degrees as high as thousands to ten thousands of gates makes it almost impossible to boost the coverage ratio by using only the test patterns, and requires some test circuit to be provided. The provision of the test circuit may result in a large scale for the entire circuit, which will reduce the effective integration degree. This is remarkable in a gate array LSI which has a predetermined number of gates on the entire chip (In the case of a customized LSI, the reduction of integration density can be minimized in some degree through the optimization of transistor size and cell arrangement). Incidentally, the term "gate array LSI" means an LSI in which only a few masks corresponding to wirings, among dozen or so of the masks used in the fabrication of the LSI, are made in accordance with the logical specifications to be developed to provide a desired electric circuit operation. In the gate array LSI, the wafers, which have been through the majority of the steps prior to the wiring steps, are previously stocked. Therefore, the turnaround time of development and fabrication cost can be greatly reduced.

These input test patterns have hitherto been manually made, which demands a very large amount of labor. Particularly, the gate array LSI, in which the most of designing operations are automated and the period of designing is shortened to one month or so, necessarily takes an increased amount of time to make the input test patterns. The long period of time-required for designing the test patterns provides one of the greatest obstacles in shortening the development period.

Thus, there has been proposed, as in U.S. patent application Ser. No. 575,706 filed on Jan. 31, 1984, now U.S. Pat. No. 4,613,970 issued 9/23/86 a partitioning diagnosis system which performs a scan-in and scan-out of test data using a dedicated test data bus. In this case, normal operation pins and test pins in the gate array are shared so that an increased number of parallel input/output pins for scan-in/out can be used. Thus, the number of the steps of the test patterns is reduced.

Here, the partitioning diagnosis is defined as a diagnosis in which an entire circuit, on the basis of logic connection information, is partitioned into groups of sequential circuits, which have a storage function of data, and groups of combinational circuits intervening therebetween which definitely determine outputs from determined inputs. This method replaces the diagnosis of the entire circuit by a diagnosis of only the combinational circuit groups in which a coverage ratio close to 100% is theoretically possible.

An example of the circuit arrangement after the partition is shown in FIG. 10. In this example, the circuits are divided into three parts. More specifically, all of the combinational circuits are divided into groups of combinational circuits 4, 5, and 6, intervened by groups of sequential circuits 1, 2, and 3. In FIG. 10, numerals 7 designate bonding pads; 8-1, 8-2, 8-3 are test data write signal lines for the individual sequential circuits groups 1 to 3, respectively; 9-1, 9-2, 9-3 are test data read signal lines for the individual sequential circuit groups 1 to 3, respectively; 16-1, 16-2, 16-3 are input control signal lines for inhibiting the input of the normal data into the sequential circuits groups 1 to 3, respectively; 10 to 15, and 18 are wirings between the sequential circuit groups 1 to 3 and the combinational circuit groups 4 to 6, which are determined by logic design; and 17-1, 17-2, 17-3 are test data bus lines dedicated to diagnosis, which transfer the test data.

The operation of the test circuits for partitioning diagnosis will be explained below. First, the case will be considered where the combinational circuits 5 are tested. In the test mode, first, with the input control signals on the lines 16-1, 16-2, and 16-3 set to a "0" level, i.e., a LOW logic level (when these signals are set to a HIGH LEVEL, the system is in the normal logic mode), the supply of the signals on the lines 10, 12 and 14 into the combinational circuits groups 1, 2 and 3, respectively is inhibited. Next, with the write signal on the line 8-2 set to the "1" level for a certain time with a certain pulse interval, test data (or test patterns) are written into the sequential circuit group 2 through the bus line 17-2. Thus, the setting of the test patterns for the combinational circuit group 5 has been completed. Next, in a normal logic mode, with the input control signal on the line 16-3 set to the "1" level for a certain time, outputs from the combinational circuit group 5, i.e., signals on the lines 14 are set into the sequential circuit group 3. The test data, written into the sequential circuit group 3, are outputted to the test data bus line 17-3 by setting the read signal on the line 9-3 to the "1" level for a certain time. Thus, the scan-in, scan-out operation of one step of the input test patterns has been completed. The above operation is repeated according to the number of steps of the test patterns to test the combinational circuit group 5 until the test coverage ratio thereof reaches 100% or the neighborhood thereof. Subsequently, the diagnosis of the combinational circuit groups 4 and 6 is also made in the same manner. Incidentally, in the example mentioned above, for the sake of simplicity, each of the sequential circuit groups is illustrated to have only one write signal line, one read signal line and one data bus line, but in effect, the individual combinational circuits included in the combinational circuit groups have plural addressing systems and so each of the above lines is composed of plural number.

In this way, in the case of diagnosis of the combinational circuit group 5, with the test patterns set in the sequential circuit group 2, the outputs from the combinational circuit group 5 are read out using the sequential circuit group 3, and after the completion of diagnosis operations for the combinational circuit group 5, the diagnosis operations for the combinational circuit group 4 will be performed. In order to test this combinational circuit group 4, with the test patterns set into the sequential circuit group 1, the outputs from the combinational circuit group 4 is read out using the sequential circuit group 2. Thus, in the conventional diagnosis system, the above diagnosis operations must be serially repeated many times corresponding to the number of divisions, which results in a very large number of test steps. Further, there are many test control lines and control signals so that some difficulty will be encountered to apply the conventional diagnosis system to the gate array LSI in which an automatic arrangement and wiring are performed by means of a DA (Design Automation) system. Further, if there are some feedback paths such as shown in FIG. 11, some racing may occur. So, generally this path must be prohibited in the logic design. However, this disadvantageously provides a significant restriction to the logic design in the gate array. In FIG. 11, numeral 20 denotes an edge type flip-flop; 21 is a D-type flip-flop; and 22, 23 are two-input NOR gates. The Q-output from the flip-flop 20 is fed back to the D-input of the flip-flop 20 via a line 24 and the two input NOR gate 22. For the sake of simplicity of illustration, no test control line are shown. In operation, when the test data is set into the flip-flop 20 in the test mode, some racing occurs since the Q-output therefrom is inputted to the D-output. In addition, the property that signals advance unidirectionally from the input side to the output side is not kept, making it impossible to make a partitioning diagnosis.

SUMMARY OF THE INVENTION

An object of this invention is to provide an integrated circuit device which can easily provide a higher fault-coverage ratio by using a smaller number of test steps.

In accordance with this invention, the conventional flip-flop, which corresponds to a logic block prepared as a cell data file in a gate array DA system, is supplied with a test latch circuit and a control circuit for accessing test data, and test control signals are shared among partitioning diagnosis units, in order to obtain a higher fault-coverage ratio with a smaller number of test steps.

DESCRIPTION OF THE PREFERRED EMBODIMENTS

Figure 1:
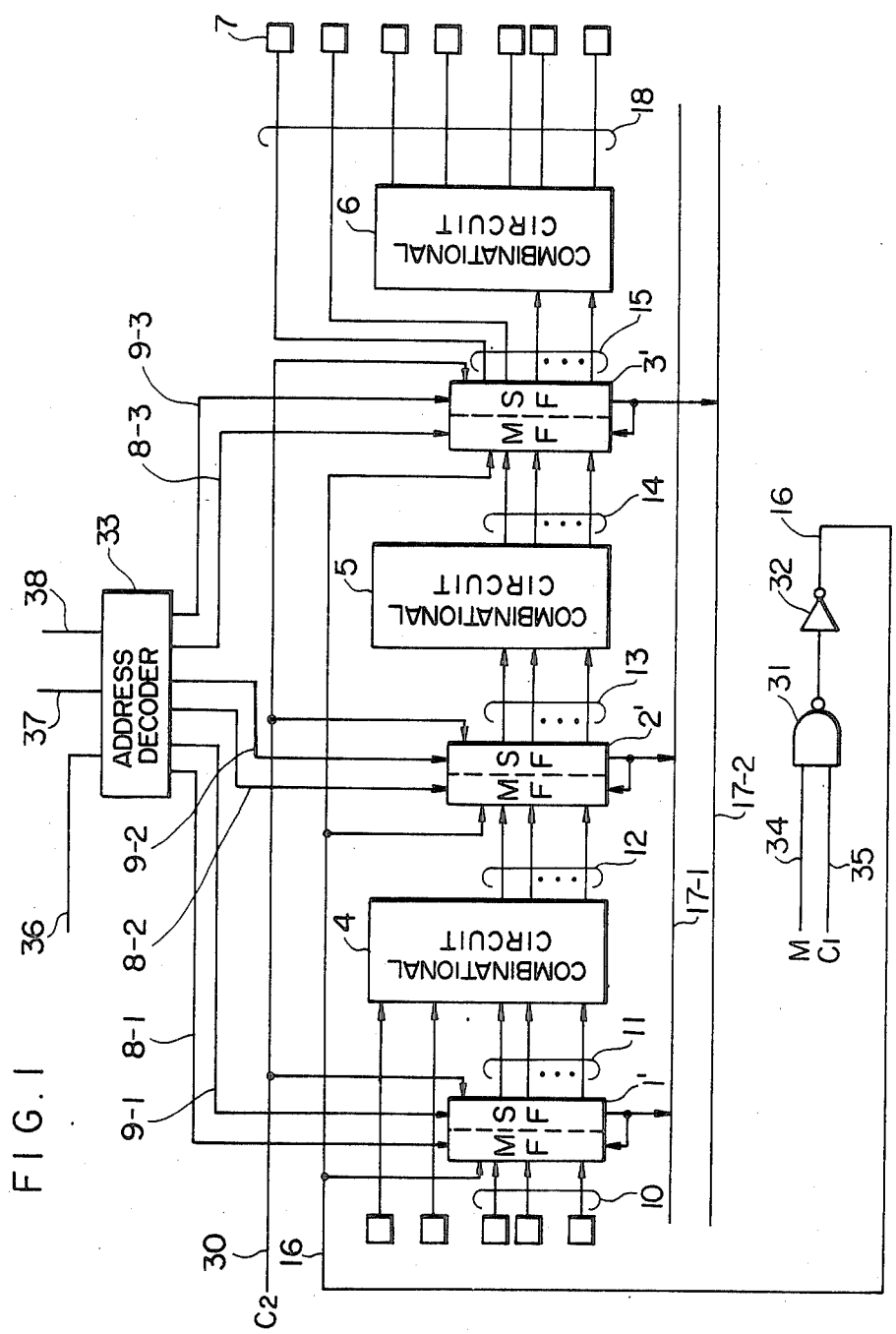
FIG. 1 is a circuit arrangement diagram illustrating the principle of this invention.

This invention will be explained in detail with reference to FIG. 1. In FIG. 1 like reference characters refer to like elements and functions in FIG. 10.

Figure 10:
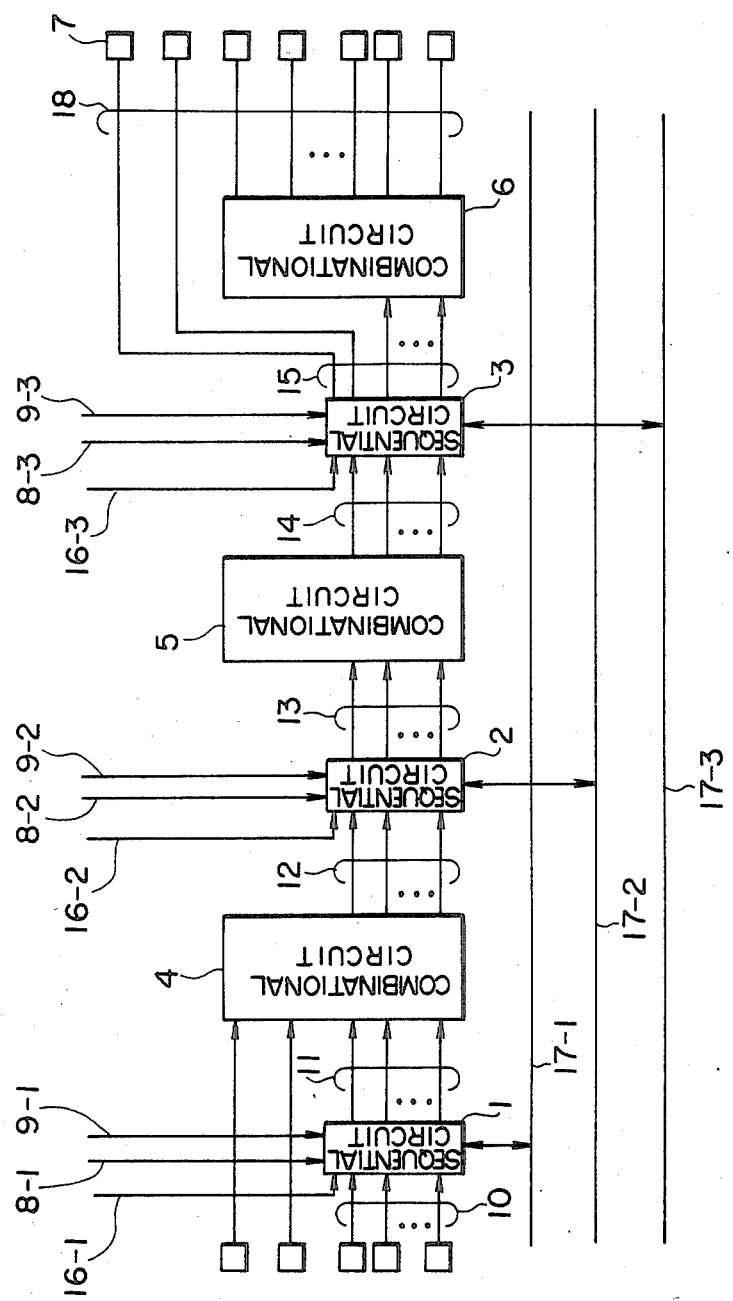
FIG. 10 is a circuit arrangement diagram showing the prior art partitioning diagnosis system.
Figure 11:
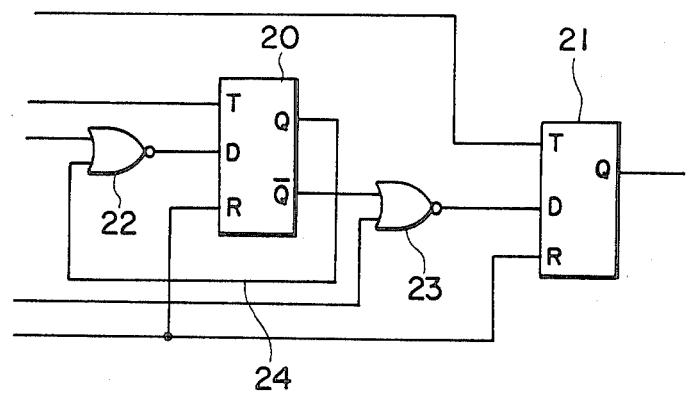
FIG. 11 is a circuit diagram for supplementary explanation of FIG. 10.

One embodiment of this invention is different from the prior art test circuit shown in FIG. 10 in that an address decoder 33 for generating read/write signals is added and the sequential circuit groups, i.e., flip-flop groups 1, 2 and 3 are replaced by flip-flop groups 1', 2' and 3' equipped with test functions (hereinafter referred to as master/slave type FF's). The master/slave type FF's 1', 2' and 3' are composed of an MF part, the conventional flip-flop and a SF part, test latch circuit, respectively. The significant feature of the one embodiment of this invention resides also in that the input control line 16 mentioned relatively to the prior art system and a latch signal line 30 for the SF parts are commonly used among the master/slave FF's 1', 2' and 3'. The input control signal on the line 16 is made from a test mode signal M and a first phase test clock $C_1$ using a two input NAND gate 31 and an inverter gate 32. When the test mode signal M is the "0" level, the entire system is in the test mode, and when it is the "1" level, the system is in the normal operation mode.

Figure 2:
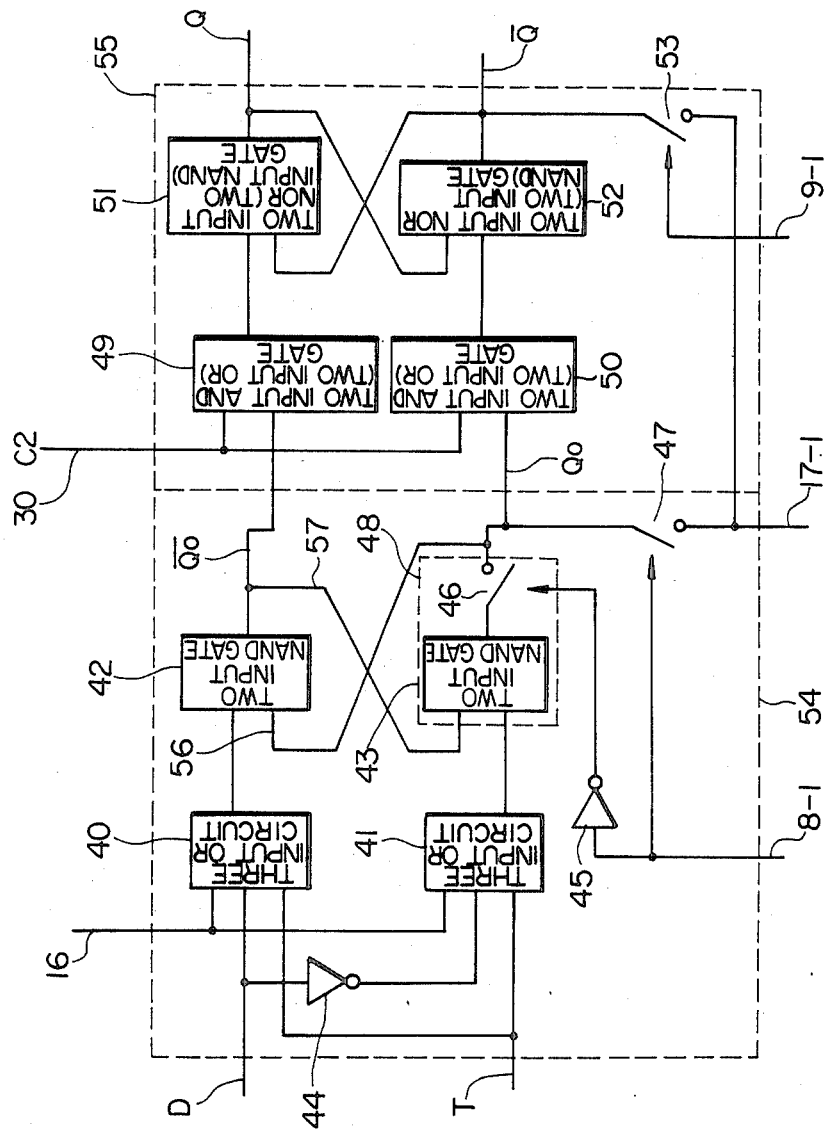
FIG. 2 is a circuit diagram for further explanation of FIG. 1.

Each of the master/slave type FF's 1', 2' and 3' is composed of the MF part 54 and the SF part 55 as shown in FIG. 2. The MF part 54 includes two input NOR gates (or two input NAND gates) 42, 43, three input AND gates (or three input OR gates) 40, 41, inverters 44, 45 for signal level inversion, and bidirectional switches 46, 47. The SF part includes two input NOR gates (or two input NAND gates) 51, 52, two input AND gates (or two-input OR gates) 49, 50, and a bidirectional switch 53. Namely, each master/slave type FF is in cascade connection of the MF part, the construction of which is determined by the logic function of the flip-flop used, and the SF part. The SF part 55 may be in a minimum construction having a latch function, and may be in a feedback construction having CMOS transmission gates in order to minimize the cell.

The operation will be explained below. In the normal operation mode (M = "1" level), with the test clock $C_1$ set to the "1" level, the input control signal ($M.C_1$) on the line 16 is the "1" level so that normal main input signals D, T are inputted into the MF part 54 through the three input AND gates 40, 41. On the other hand, with the signals on the write signal line 8-1 and the read signal line 9-1 being on the "0" level, the switches 47, 53 are in the OFF state while the switch 46 is in the ON state. Thus, the master/slave FF is electrically separated from the test bus line 17-1. In the normal operation mode, a latch signal $C_2$ for the SF part 55 is fixed to the "1" level so that the outputs $\overline{QO}$, QO from the MF part 54 are inputted into the SF part 55 through the input AND gates 49, 50 and outputted as outputs, Q, $\overline{Q}$. Thus, in the normal operation mode, the signals $\overline{QO}$, QO from the MF part 54 are only outputted through the SF part 55, a latch circuit, without any variation. However, the Q, $\overline{Q}$ outputs are delayed by the delay time of the SF part 55, with the delay increase generally corresponding to a one gate delay or so.

In the test mode (M="0" level), the input control signal on the line 16 becomes the "0" level regardless of the level of $C_1$ so that the outputs from the three input AND gates 40, 41 are fixed to the "0" level, and the normal inputs D, T are not inputted into the MF part 54. A write operation of the test data is performed in this condition. With the write signal line 8-1 being on the "1" level during a certain period, the test data are transferred onto data bus line 17-1. Then, the switch 47 is in the ON state while the switch 46 is in OFF state so that the output from the two input NOR gate 43 does not compete with the test data on the bus line 17-1. Thus, the test data is written and stored, through signal lines 56, 57, into a latch circuit consisting of the two input NOR gates 42 and 43. Then, with the latch signal $C_2$ being the "1" level during a certain period, the above stored test data are transferred to the SF part 55, the latch circuit. Subsequently, a read operation is performed in such a way that the output $\bar{Q}$ is transferred to the data bus line 17-1 with the switch 53 being in the ON state by keeping the read signal line 9-1 on the "1" level during a certain period.

Figure 3:
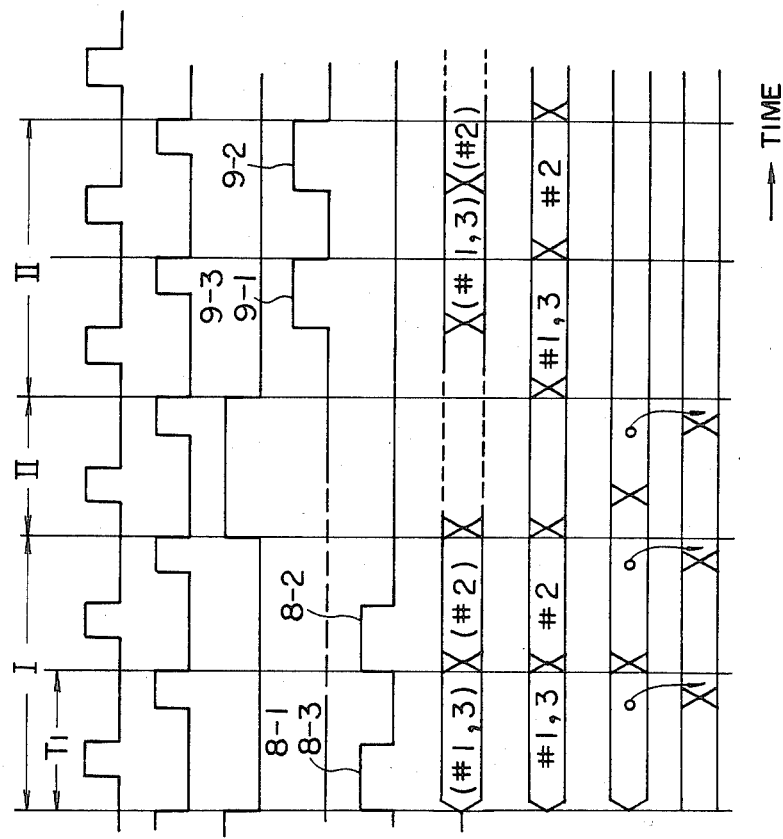
FIGS. 3A-3I are a time chart illustrating this invention.

Returning to FIG. 1, the features and gist of the embodiment of this invention will be explained below. The test procedure is shown in the timing chart of FIGS. 3A to 3I:

(1) With the signal M set to the "0" level as shown in FIG. 3C, and with the write signal being on the "1" level during a certain period as shown in FIG. 3E, the test data on the data bus line is written. The write signal is produced so as to select the flip-flop group which is determined by the combination of logic levels of address inputs 37, 38 of the address decoder 33. Incidentally, the test clock is composed of two phase clocks $C_1$ and $C_2$ as shown in FIGS. 3A and 3B, and is repeated with a period $T_1$. All the input control signals and test data are generated in synchronism with the above clocks $C_1$, $C_2$. In the example of FIG. 1, the test bus lines consist of two lines 17-1 and 17-2. The line 17-1 is connected with the flip-flops 1' and 2', and the line 17-2 is connected with the flip-flop 3'. Thus the write operation requires two periods.

Moreover, for the sake of simplicity of illustration, the flip-flop groups 1', 2', and 3' are illustrated to consist of only one flip-flop (in this case, one address is applied to each flip-flop group), respectively, but actually each of the flip-flop groups is composed of plural flip-flops and so plural addresses are applied to each flip-flop group. Therefore, still more test steps are required for the write operation explained in the above item (1) with reference to FIGS. 3A–3C and 3E. This also applies for a read operation. The test data written into the MF part at the first half of the period $T_1$ is transferred to the SF part at the second half thereof with $C_2$ set to the "1" level.

(2) In the normal operation mode, the test mode signal M is set to the "1" level during the interval II as shown in FIG. 3C to place the input control signal on the line 16 on the "1" level, thereby supplying the outputs from the combinational circuits 4, 5 into the flip-flops 2', 3' (MF parts), respectively. Thus, the outputs in response to the test patterns to the combinational circuits are latched into the flip-flops at the receiving side.

(3) The test data set in the MF parts are transferred to the SF parts, with the signal $C_2$ on the line 30 being on the "1" level during a certain period. This is performed simultaneously (i.e. in one step) for all the flip-flops contained in the same chip.

(4) The test data latched in the SF parts of the flip-flops 1', 2' and 3' are read out from the corresponding bus lines with the read signals on the lines 9-1, 9-2 and 9-3 serially or in parallel set to the "1" level. The test data are inputted or outputted from and to pads through external buffers. The read operation can also be performed, as in the write operation, in the manner of parallel reading corresponding to the number of data bus lines, and so the number of steps can be correspondingly reduced.

In this way, adopting the flip-flops of a master/slave structure, as shown in FIG. 2, makes it possible to set the response patterns from all the combinational circuits in a chip into their receiving side-flip-flops in one step, and also makes it easy to read out the response test data. This is because when the outputs from the combinational circuits are set into the flip-flops at the receiving side, the inputs to the subsequent combinational circuits don't change due to the master/slave FF structure. Moreover, the restriction in the user's logic design in a gate array LSI, e.g., the inhibition of using the feedback circuit is cancelled. This embodiment of this invention is preferably suited to the DA system of the gate array since the number of control signals and wirings for accessing each flip-flop is relatively small.

Hereinafter, concrete embodiments of this invention will be explained.

Figure 4:
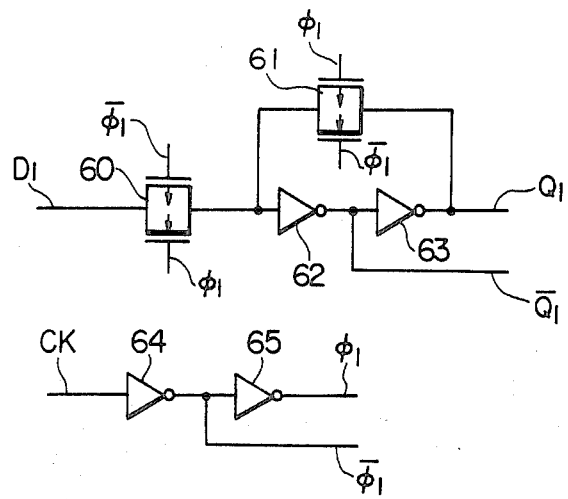
FIG. 4 is a circuit diagram of the conventional flip-flop.
Figure 5:
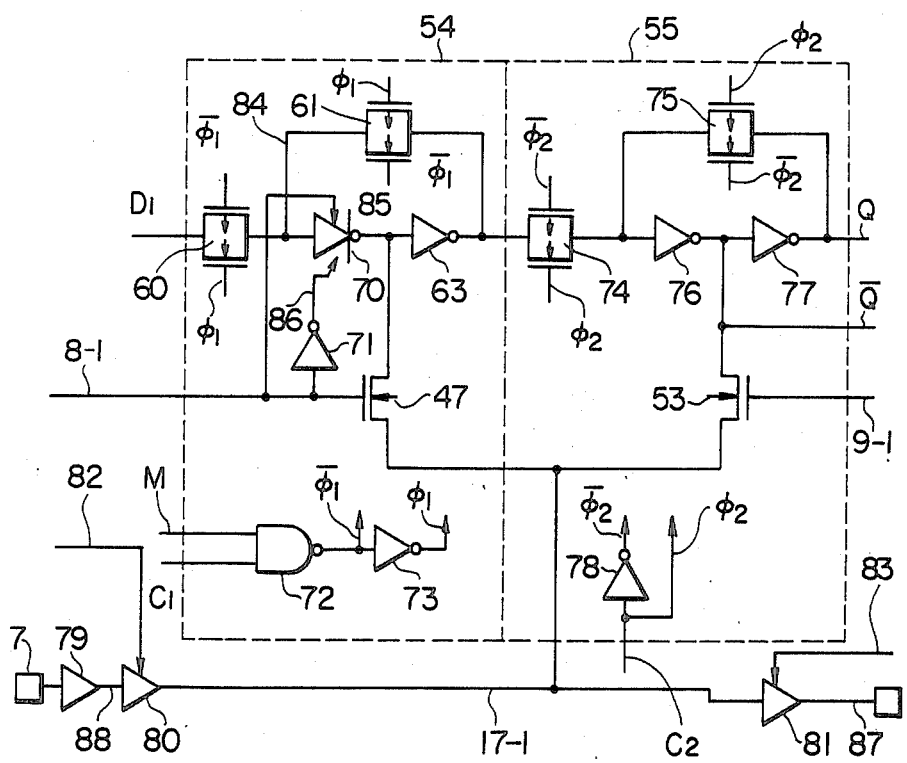
FIG. 5 is a circuit diagram showing one concrete embodiment of this invention.
Figure 6:
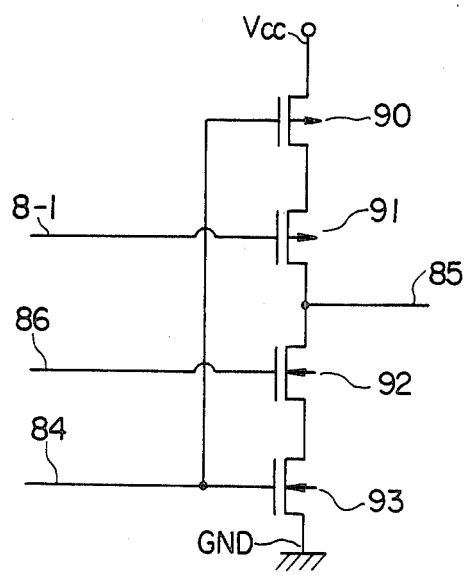
FIGS. 6 and 7 are circuit diagrams for supplementary explanation of FIG. 5.

FIG. 5 shows one concrete embodiment of this invention which is adapted to a D-type flip-flop including CMOS transmission gates. FIG. 4 shows the ordinary flip-flop which is composed of CMOS transmission gates 60, 61 and inverters 62 to 65. This is well known and its explanation will be omitted here. Further, in FIG. 7, like reference characters refer to like elements and functions in FIGS. 6, 1 and 2.

The flip-flop in this embodiment is composed of the MF part 54 and the SF part 55. The MF part 54 consists of CMOS transmission gates 60, 61, a clocked gate inverter 70, inverters 63, 71, 73, an NMOS transfer gate 47, and a two input NAND gate 72, and the SF part 55 consists of CMOS transmission gates 74, 75, inverters 76, 77, 78, and an NMOS transfer gate 53. There are also shown a three-state buffer 80 for writing test data through the data bus line 17-1, a three-state buffer 81 for reading out the test data, and an input buffer 79. The three state buffers 80, 81 are on-off controlled by signals 82, 83 having the same timing and logical level as the write signal 8-1 and the read signal 9-1, respectively. However, the signals 82, 83 do not include the FF-address signal information.

The operation of the flip-flop shown in FIG. 5 is substantially the same explanation as in FIG. 2, and so only its main features will be mentioned below.

Figure 7:
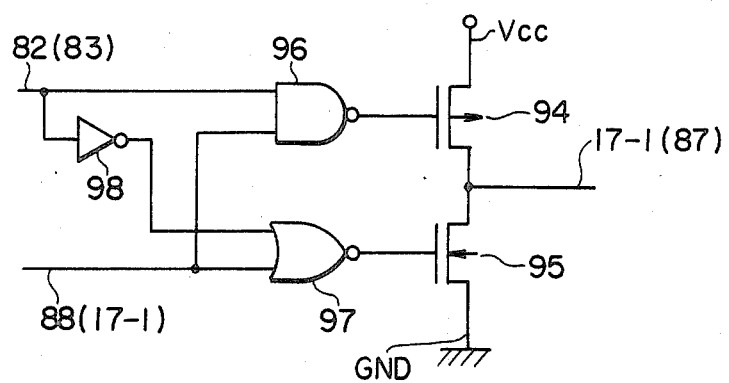

When the test mode signal M is the "0" level, $\phi_1$ is the "0" level and $\bar{\phi_1}$ is on the "1" level, so that the CMOS transmission gates 60, 61 are on the OFF and ON states, respectively. Thus, the input $D_1$ is inhibited. The write operations of the test data are performed by placing the NMOS transfer gate 47 in the ON state and the clocked gate inverter 70 in the OFF state, which means that its output is in a high impedance state, with the write signal 8-1 being on the "1" level during a certain period. The block 48 indicated by a dotted line in FIG. 2 corresponds to the clocked inverter 70. The clocked gate inverter 70 and the three-state buffers 80, 81 are illustrated in detail in FIGS. 6 and 7, respectively. The clocked gate inverter 70 is formed by a series connection of PMOS transistors 90, 91 and NMOS transistors 92, 93. The respective gates of PMOS transistor 90 and NMOS transistor 93 are commonly connected to serve as an input terminal 84'. When the write signal 8-1 is on the "1" level, which means the "0" level of the signal 86 it is an inversion signal of the write signal 8-1, both PMOS transistor 91 and NMOS transistor 92 are on the OFF state so that the output 85 is in the high impedance state regardless of the level of the input signal 84. Inversely, when the write signal 8-1 is on the "0" level, both PMOS transistor 91 and NMOS transistor 92 is in the ON state so that the output 85 becomes an inversion signal of the input 84. The three-state buffers 80, 81 as shown in FIG. 7 are composed of a PMOS transistor 94, an NMOS transistor 95, a two input NAND gate 96, a two input NOR gate 97 and an inverter 98. When the control signal 82 is on the "0" level, the outputs of the two input NAND gate 96 and the two input NOR gate 97 are fixed to the "1" and "0" levels, respectively, so that both PMOS transistor 94 and NMOS transistor 95 are in the OFF state and so the output 17-1 is in the high impedance state. Inversely, when the control signal 82 is on the "1" level, both outputs of the two input NAND gate 96 and two input NOR gate 97 are determined by the signal level of the input 88 and so they act as a non-inversion output buffer.

In this embodiment, D-type flip-flops including CMOS transmission gate are used in order to minimize the cell size.

Figure 8:
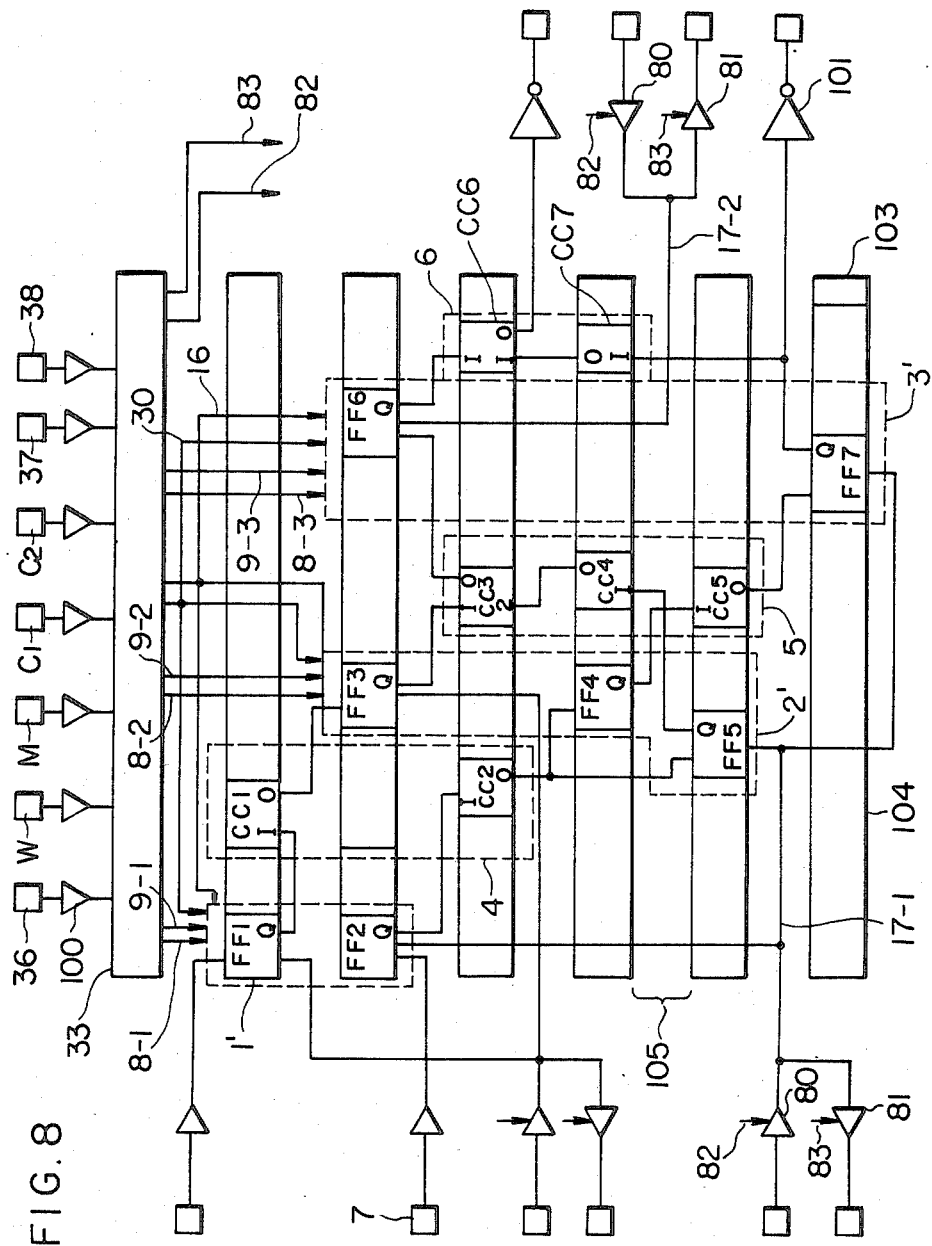
FIG. 8 is a circuit diagram showing the other concrete embodiment.

FIG. 8 shows the other concrete embodiment of this invention which is adapted to a gate array. This basically corresponds to implementation of FIG. 1 by means of the gate array.

The gate array LSI, as already explained, is an LSI in which only the masks corresponding to wirings, among dozen or so masks used in the fabrication of the LSI, are made in accordance with the logical specifications to be developed to provide a desired electric circuit operation. The gate array LSI permits the wafers, which have finished pre-wiring process steps, to be previously stocked and the wiring pattern to be made through automatic placement and routing DA (design automation) system. Therefore, the period of development and fabrication cost are greatly reduced.

The embodiment shown in FIG. 8, as in the ordinary gate array, takes an arrangement in which basic cell rows 104 each composed of basic cells 103 arranged in the X direction are repeatedly arranged with wiring areas 105 intevening therebetween. Input/output signals are transferred from bonding pads 7 to logic cells serving as flip-flops or gates through input buffers 100, or sent out from the logic cells through output buffers. The three-state controlled input buffers 80 and the three-state controlled output buffers 81 are generally formed by external cells. The circuit structures and operations of these buffers 80, 81 have already been explained with reference to FIG. 7. This embodiment adopts the same arrangement as FIG. 1 for the sake of simplicity of illustration. More specifically, there are provided the address decoder and test timing generating circuit 33, and all of the combinational circuits in a chip are partitioned into combinational circuits groups indicated by dotted lines 4, 5, 6. Also, these groups are intervened between FF group 1' consisting of flip-flops FF's 1 and 2, FF group 2' consisting of flip-flops FF's 3, 4 and 5 and FF groups 3' consisting of FF's 6 and 7; each of all these flip-flops including a latch for testing use. For example, the combinational circuit group 4 consists of logic gate cells $CC_1$ and $CC_2$; the combinational circuit group 5 consists of logic gate cells $CC_3$, $CC_4$ and $CC_5$; and the combinational circuit group 6 consists of logic gate cells $CC_6$ and $CC_7$. The FF's belonging to the same FF group are connected with the common write/read signal line, and the test bus lines connected to the FF's at the same address are separated from one another.

The write/read operations of the test data in the individual FF's belonging to the same FF group are simultaneously performed through the test bus line. It is apparent that even if a test bus line is commonly connected to the FF's in the same FF group, and a plural number of write/read signals is provided, no problem occurs in the test mode operation. The routing of these test bus lines is carried out through an automatic routing DA program so that high versatility is provided. The address mapping, and logic circuits for read/write signals and the test bus lines can be computer-generated to minimize the number of test clock steps.

Figure 9:
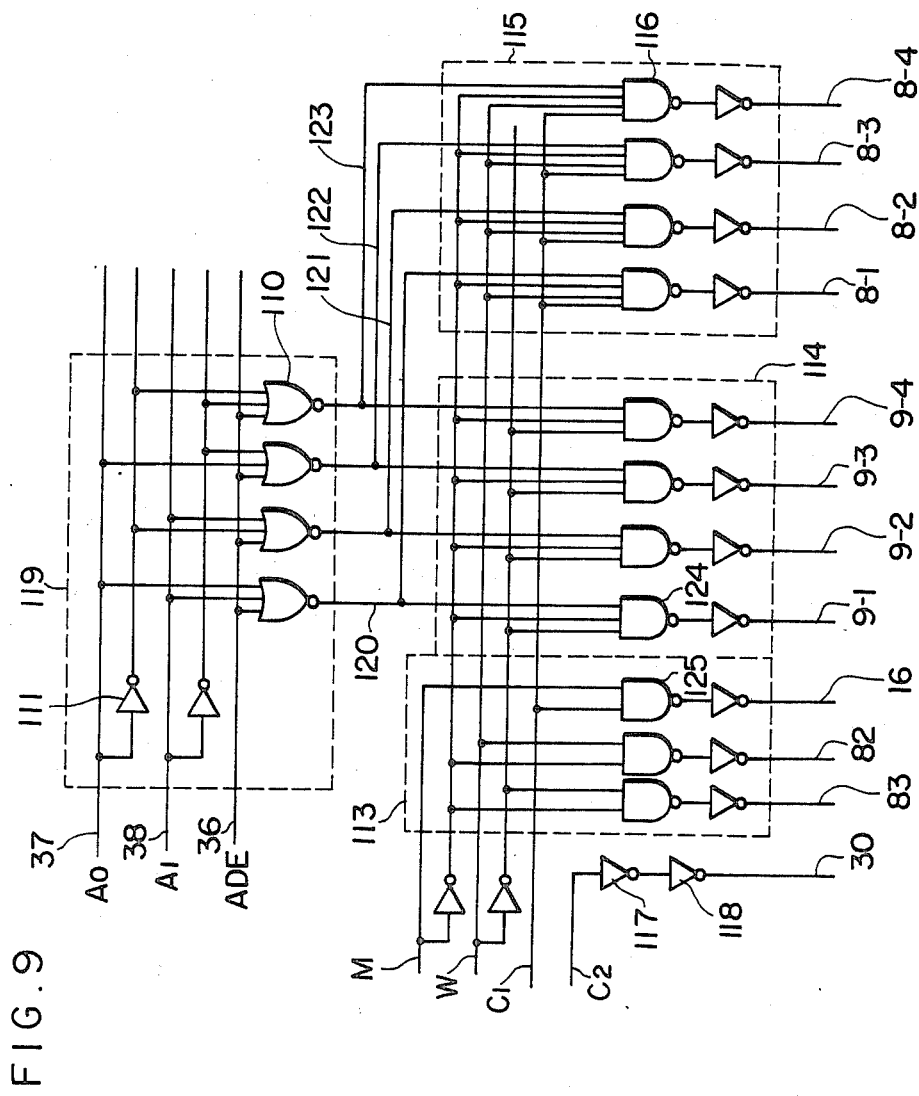
FIG. 9 is a detail circuit diagram of the address decoder and control circuit shown in FIG. 8.

The address decoder and control circuits 33 are implemented in the circuits of FIG. 9. In this figure, like reference characters refer to the like elements mentioned previously. The address decoder and control circuits 33 are, as indicated by dotted lines, composed of a two input-four output address decoder 119, a read signal generating circuit 114, a write signal generating circuit 116 and a timing generating circuit 113. The address decoder 119 consists of two inverters 111 and four three-input NOR gates 110, and, as well known, outputs a "0" address output 120, "1" address output 121, "2" address output 122 or "3" address output 123, depending upon the combination of address input signals 37 (A0) and 38 (A1). When an address enable signal 36 (ADE) is on the "1" level, all four outputs from NOR gates 110 are on the "0" level and only when the signal 36 is on the "0" level, the address decoder 119 becomes active. The write signal generating circuit 115 consists of four four-input NAND gates 116 and four inverters, and the read signal generating circuit 114 consists of four three-input NAND gates 124 and four inverters. The write signals 8-1-8-4 and the read signals 9-1-9-4 are generated from the test mode signal M, write signal W and test clock on the basis of the logic formulas:

$$\text{(Write signal)} = \overline{M} \cdot W \cdot C_1 \cdot X_1 \cdot \overline{ADE} \quad (1)$$

$$\text{(Read signal)} = \overline{M} \cdot \overline{W} \cdot X_1 \cdot \overline{ADE} \quad (2)$$

where ADE is a logical level of the address enable signal, and $X_i$ is a logical level of the $X_i$ address output. With M="0" level and $\overline{ADE}$="1" level, if W="0" level, the read signal is generated and if W="1" level, the write signal is generated. The timing generating circuit 113 consists of three two-input NAND gates 125 and three inverters or drivers, and generates an input control signal on the line 16, and control signals on the lines 82, 83, which are represented by the logical formulas:

$$\text{(Input control signal)} = M \cdot C_1$$

$$\text{(Control signal on 82)} = \overline{M} \cdot W$$

$$\text{(Control signal on 83)} = \overline{M} \cdot \overline{W}$$

The test clock $C_2$ is generated by inverters 117, 118 which also act as drivers.

Explanation of the functions of these signals and the test procedure is omitted since they are substantially the same as that relative to FIG. 1.

Thus, in accordance with this embodiment of the invention, a high fault-coverage ratio is easily realized with a smaller number of testing steps, and a semiconductor integrated circuit device suited to a gate array can be obtained without placing any restriction on the logic design. The other advantages are that the number of wirings for testing is reduced and the test circuits used are relatively small.

As explained above, in accordance with this invention, a higher fault-coverage ratio is assured with a smaller number of steps for testing and lower-scale test circuits.

What is claimed is:

1. An integrated semiconductor circuit device comprising:
   a combinational circuit group;
   a sequential circuit group coupled to inputs of the combinational circuit group, wherein each sequential circuit within said sequential circuit group comprises:
   a master flip-flop circuit;
   a slave latch circuit;
   input terminals to receive a main input signal;
   a common input control signal terminal coupled to means within said sequential circuit to conrol entry of the main input signals into said sequential circuit;
   a test data terminal coupled to means within said sequential circuit to provide a testing function for said sequential circuit;
   a read terminal and/or a write terminal coupled to means within said sequential circuit for controlling transfer of test data generated in said sequential circuit during said testing function; and
   a latch signal terminal coupled to means within said sequential circuit for providing a shift clock to said sequential circuit to scan-out said test data.

2. An integrated semiconductor circuit device according to claim 1, wherein scan-in of the test data is effected through a bus-like test data line connected to said test data line.

3. An integrated semiconductor circuit device according to claim 2, wherein the scan-out of test data is effected through a bus-like test data line connected to a data output terminal of the latch circuit.

4. An integrated semiconductor circuit device according to claim 3, wherein said input control signal terminal of the flip-flops and said latch timing signal terminal for the latch circuits, in all of the sequential circuits, are connected in common, respectively.

5. An integrated semiconductor circuit device according to claim 2, wherein said sequential circuit group is divided into flip-flop groups by means of address, and either the read or write terminal of each flip-flop is connected in common in each flip-flop group, or the test data terminal of each flip-flop is connected in common.

6. An integrated semiconductor circuit device according to claim 5, wherein said input control signal terminal of the flip-flops and said latch timing signal terminal for the latch circuits, in all of the sequential circuits, are connected in common, respectively.

7. An integrated semiconductor circuit device according to claim 2, wherein said sequential circuit group is divided into latch groups by means of address, and either the read or write signal terminal of each latch is connected in common in each latch group, or each input terminal and each output terminal of each latch is connected in common.

8. An integrated semiconductor circuit device according to claim 2, wherein said input control signal terminal of the flip-flops and said latch timing signal terminal for the latch circuits, in all of the sequential circuits, are connected in common, respectively.

9. An integrated semiconductor circuit device according to claim 1, wherein the scan-out of test data is effected through a bus-like test data line connected to a data output terminal of the latch circuit.

10. An integrated semiconductor circuit device according to claim 9, wherein said sequential circuit group is divided into flip-flop groups by means of address, and either the read or write terminal of each flip-flop is connected in common in each flip-flop group, or the test data terminal of each flip-flop is connected in common.

11. An integrated semiconductor circuit device according to claim 9, wherein said sequential circuit group is divided into latch groups by means of address, and either the read or write signal terminal of each latch is connected in common in each latch group, or each input terminal and each output terminal of each latch is connected in common.

12. An integrated semiconductor circuit device according to claim 9, wherein said input control signal terminal of the flip-flops and said latch timing signal terminal for the latch circuits, in all of the sequential circuits, are connected in common, respectively.

13. An integrated semiconductor circuit device according to claim 1, wherein said input control signal terminal of the flip-flops and said latch timing signal terminal for the latch circuits, in all of the sequential circuits, are connected in common, respectively.

* * * * *